United States Patent
Kuan

(10) Patent No.: US 10,903,103 B2
(45) Date of Patent: Jan. 26, 2021

(54) FRONT OPENING UNIFIED POD

(71) Applicant: NANYA TECHNOLOGY CORPORATION, New Taipei (TW)

(72) Inventor: Shih-Fan Kuan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 38 days.

(21) Appl. No.: 15/876,214

(22) Filed: Jan. 22, 2018

(65) Prior Publication Data

US 2019/0229000 A1  Jul. 25, 2019

(51) Int. Cl.
*H01L 21/673* (2006.01)
*H01L 21/677* (2006.01)

(52) U.S. Cl.
CPC .. *H01L 21/67389* (2013.01); *H01L 21/67393* (2013.01); *H01L 21/67772* (2013.01)

(58) Field of Classification Search
CPC ......... H01L 21/67389; H01L 21/67772; H01L 21/67393; H01L 21/67383; H01L 21/6735
USPC .................................................. 206/711, 454
See application file for complete search history.

(56) References Cited

U.S. PATENT DOCUMENTS

| | | | |
|---|---|---|---|
| 4,745,088 A * | 5/1988 | Inoue ................... | C23C 16/4584 117/101 |
| 5,879,458 A * | 3/1999 | Roberson, Jr. .... | H01L 21/67017 118/715 |
| 6,364,922 B1 * | 4/2002 | Tanaka .............. | H01L 21/67393 206/710 |
| 6,368,411 B2 * | 4/2002 | Roberson, Jr. .... | H01L 21/67017 118/715 |
| 6,488,775 B2 * | 12/2002 | Shimizu ................ | C23C 16/455 118/715 |
| 6,899,145 B2 * | 5/2005 | Aggarwal ......... | H01L 21/67393 141/11 |
| 8,413,814 B2 * | 4/2013 | Ku ..................... | H01L 21/67383 206/710 |
| 8,413,815 B2 * | 4/2013 | Ku ..................... | H01L 21/67369 206/711 |
| 8,783,463 B2 * | 7/2014 | Watson ............. | H01L 21/67393 206/710 |
| 8,895,356 B2 * | 11/2014 | Maeng .................. | C23C 16/458 438/104 |
| 9,054,144 B2 * | 6/2015 | Burns ............... | H01L 21/67376 |
| 10,043,696 B2 * | 8/2018 | Watson ............. | H01L 21/67393 |
| 10,101,047 B2 * | 10/2018 | Lo ............................ | F24F 7/04 |
| 2004/0182472 A1 | 9/2004 | Aggarwal | |
| 2005/0077204 A1 * | 4/2005 | Sumi ..................... | F16K 15/026 206/710 |

FOREIGN PATENT DOCUMENTS

CN          107431035 A     12/2017

* cited by examiner

*Primary Examiner* — Steven A. Reynolds
(74) *Attorney, Agent, or Firm* — CKC & Partners Co., LLC

(57) ABSTRACT

A front opening unified pod (FOUP) includes a container, a plurality of wafer slots, at least one inlet pipe, and at least one outlet pipe. The wafer slots, the inlet pipe, and the outlet pipe are disposed in the container. The inlet pipe has a plurality of exhale openings arranged along the inlet pipe. The outlet pipe has a plurality of inhale openings arranged along the outlet pipe.

19 Claims, 9 Drawing Sheets

FRONT OPENING UNIFIED POD

BACKGROUND

Field of Invention

The present invention relates to the field of semiconductor processing apparatus, and specifically to a Front Opening Unified Pod (FOUP).

Description of Related Art

In the semiconductor manufacturing industry, a FOUP (Front Opening Unified Pod) is a container used to portably store semiconductor wafers between processing steps. FOUPs are typically configured to be placed at an interface of a processing tool and are generally provided with a door configured to be automatically removed. Depending on a number of factors such as the size of a production run, cycle time, etc, wafers may sit in a FOUP for a substantial length of time between processing steps. During this time, it is possible for oxygen and moisture to leak into the FOUP. Unfortunately, moisture and oxygen have detrimental effects on the surfaces of semiconductor wafers, and thus it is desirable to minimize the exposure of the wafers to these elements.

Moisture and oxygen levels can be reduced within an enclosed FOUP by introducing a purge gas (typically $N_2$). Such FOUPs may have inlet and outlet pipes in their bottom surface. While purging delays or reduces oxidation and particle formation in the FOUP, there is a remaining need for a process for more quickly and efficiently reducing moisture and oxygen content within a FOUP to acceptable levels.

SUMMARY

In some embodiments of the present disclosure, at least one inlet pipe and at least one outlet pipe are disposed in a container of a FOUP. The inlet pipe has a plurality of exhale opening arranged along the inlet pipe, and outlet pipe has a plurality of inhale opening arranged along the outlet pipe, respectively. The exhale openings of the inlet pipe correspond respectively to the inhale openings of the outlet pipe so as to direct a gas flow from the exhale openings into spaces between two adjacent wafers and remove the gas flow through the outlet pipe. With this configuration, the gas flow along surfaces of the wafers may be stable and approaches to a laminar flow instead of a turbulent flow. Accordingly, particles dropping on the wafer surface may be reduced, thereby improving the purging quality of the FOUP.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
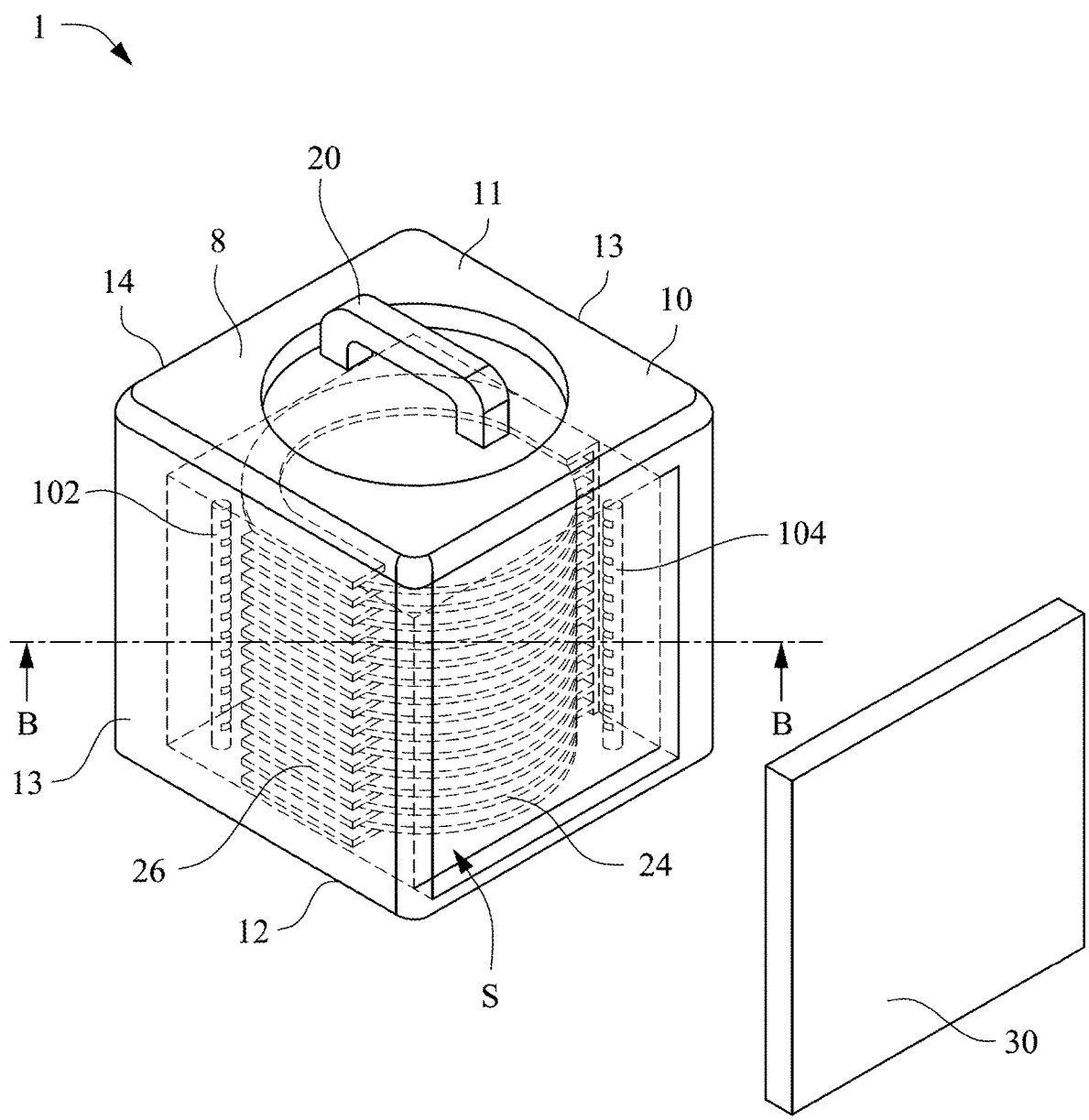
FIG. 1A is a perspective view of a FOUP in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
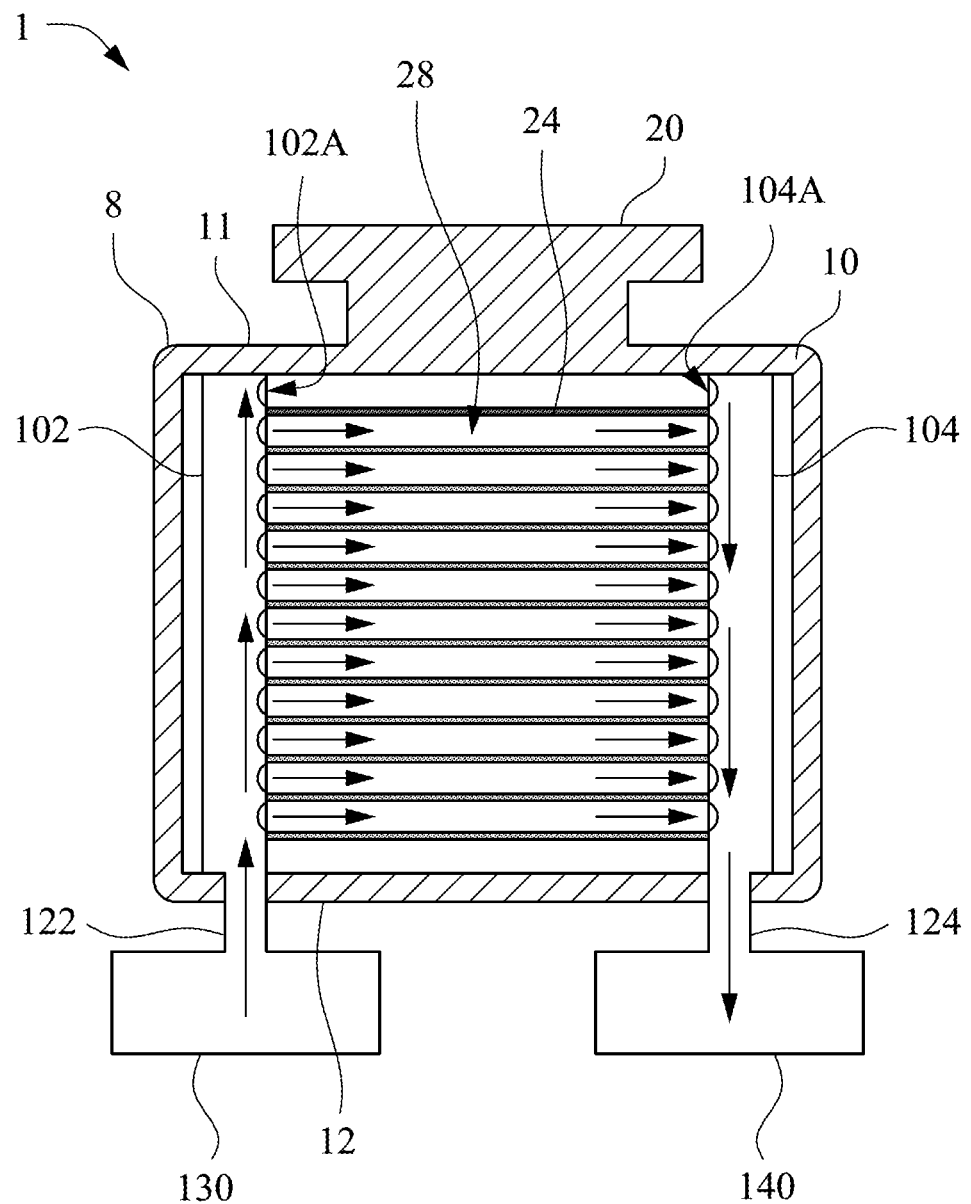
FIG. 1B is cross-sectional view along line B-B of FIG. 1A.
Figure 1C:
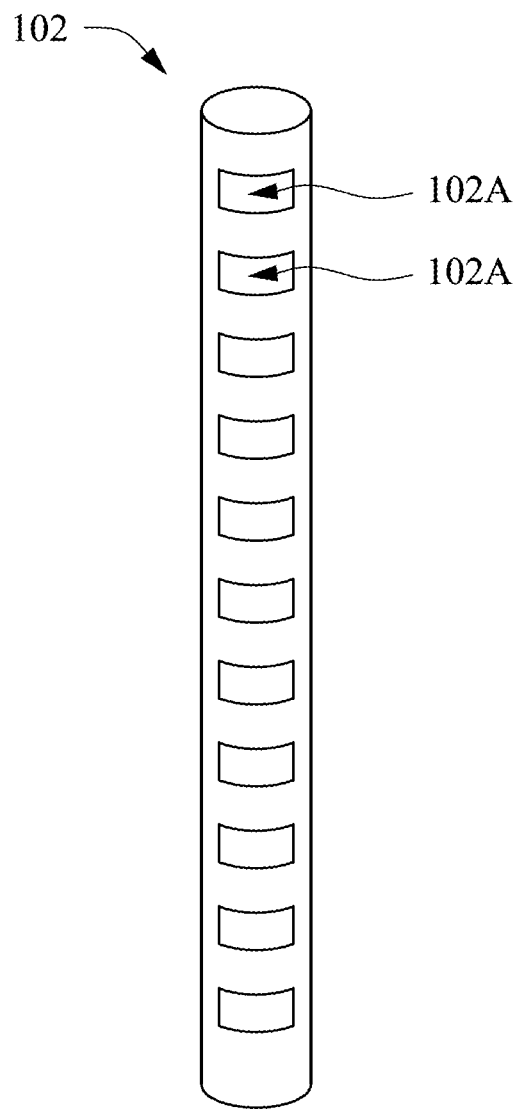
FIG. 1C is a perspective view of a gas pipe in accordance with some embodiments of the present disclosure.

FIG. 1A is a perspective view of a FOUP in accordance with some embodiments of the present disclosure. FIG. 1B is cross-sectional view along line B-B of FIG. A. FIG. 1C is a perspective view of a gas pipe in accordance with some embodiments of the present disclosure.

Reference is made to FIGS. 1A and 1B. During transport and storage in a semiconductor fabrication facility, wafers are contained inside a container, which may be a front opening unified pod (FOUP) 1 shown in FIG. 1A. The FOUP 1 includes a container 10 and a door 30. Similar to a standard open wafer cassette, the door 30 is provided for "sealing" the container 10 of the FOUP 1 during transport. In some embodiments, the door 30 includes a pair of key slots configured to be engaged to lock and unlock the door 30 from the container 10. In some embodiments, the FOUP 1 has a standard mechanical interface for attaching to process tools. The FOUP 1 is designed to isolate the wafers from ambient particulate and molecular contamination, while also providing accurate wafer positioning.

The container 10 of the FOUP 1 has a top 11, a bottom 12, two opposite sidewalls 13, and rear wall 14, in which the top 11, the bottom 12, the sidewalls 13 and the rear wall 14 collectively define an accommodation spacer S of the container 10. In the present embodiment, the container 10 is fitted with a handle 20 for transporting the FOUP 1 manually, but the disclosure is not limited thereto. In some other embodiments, a plurality of handles may be configured on sidewalls 13 of the container 10 of the FOUP 1.

In some embodiments, a sealing mechanism (not shown) may be configured at the front opening of the container 10 of the FOUP 1 that is designed to press against and seal to a surface of a loading port at a process tool. The skilled artisan will appreciate, however that standardized FOUPs are not truly hermetically sealed, such that small amounts of oxygen, moisture or particles can leak into the FOUP over extended periods of time.

In the accommodation spacer S of the container 10, a plurality of wafer slots 26 defined by vertically spaced shelves are configured for holding and separating the wafers 24. Inside, the wafers 24 are held spaced apart in a stack and supported by the wafer slots 26. For example, the wafers 24 may be inserted through the opening of the container 10 and be placed on the wafer slots 26. In some embodiments, the wafer slots 26 are formed on the inner sidewalls of the container 10.

A gas pipe 102 and a gas pipe 104 are disposed in the accommodation space S of the container 10. In the present embodiment, the gas pipe 102 is provided to import gas, such as purge gas, and the gas pipe 104 is provided to remove the gas. Accordingly, in the following discussion, the gas pipe 102 and the gas pipe 104 are referred to as an inlet pipe 102 and an outlet pipe 104, respectively. However, the present disclosure is not limited thereto, a person skilled in this art may arrange the gas pipe 102 and the gas pipe 104 in a desired way.

The inlet pipe 102 is disposed at a corner close to the back side of the accommodation space S of the FOUP 1, and the outlet pipe 104 is disposed at a corner close to the front side of the accommodation space S of the container 10, respectively. In greater detail, from a top view of the container 10, the inlet pipe 102 and the outlet pipe 104 are disposed respectively at corners along the diagonal of the accommodation space S of the container 10. It is noted that the back side of the accommodation space S is defined as a side close to the rear wall 14 of the container 10, and the front side is defined as a side close to the opening of the container 10, respectively.

With reference to FIG. 1B, the FOUP 1 further includes a plurality of gas ports 122 and 124 configured at the bottom 12 of the container 10. The inlet pipe 102 and the outlet pipe 104 are communicated respectively with the gas ports 122 and 124. The gas ports 122 and 124 may also be referred to as an inlet port 122 and an outlet port 124, respectively.

The gas port 122 may be joined in fluid communication with a gas source 130 so as to provide gas (e.g. purge gas) into the container 10 of FOUP 1 through the inlet pipe 102 and gas port 122. In some embodiments, the gas port 122 may include a check valve configured to limit a flow of purge gas to a single direction, for example gases may flow into, but not out of the container 10 of FOUP 1. Many check valve designs are known to those skilled in the art, many of which may be used with a FOUP of the present embodiment. In some embodiments, the purge gas may be inert gas, such as Ar, He, other suitable inert gas, or combination thereof. In some other embodiments, the purge gas may be reducing gases such as $N_2$ in order to help slow or reverse natural oxidation processes.

The gas port 124 can be joined in fluid communication with a vacuum pump 140 in order to aid in the replacement of an oxygen and moisture rich atmosphere with a purge gas. The vacuum pump 140 can be used to maintain a pressure within the accommodation space S of the container 10 within a desired range. Typically, the pressure within the FOUP is maintained within a few PSI above atmospheric pressure. For example, the pressure may be maintained between about 14 PSI and about 17 PSI, preferably between about 14 PSI and about 16 PSI, and often between about 14.5 PSI and about 15.5 PSI. In one embodiment, the pressure within the FOUP is maintained at about 15.2 PSI. In some embodiments, the gas port 124 can also be provided with a check valve as desired. It is noted that the gas ports 122 and 124, the gas source 130, and the vacuum pump 140 are not depicted in FIG. 1A for simplicity.

Reference is made to FIGS. 1B and 1C. FIG. 1C is a gas pipe in accordance with some embodiments of the present disclosure. Shown there is the inlet pipe 102 having a tubular shape with plural openings 102A disposed thereon. It is noted that the shape of the outlet pipe 104 may be the same as or similar to that of the inlet pipe 102, and will not be repeated hereinafter.

The inlet pipe 102 and the outlet pipe 104 extend vertically above the bottom 12 of the container 10 of FOUP 1. The inlet pipe 102 includes a plurality of exhale openings 102A configured to distribute flow along the height of the inlet pipe 102. In the illustrated embodiment, both of the inlet pipe 102 and the outlet pipe 104 extend substantially the full height of the container 10 of the FOUP 1, and include a plurality of exhale openings 102A and inhale openings 104A spaced such that they will direct a flow of purge gas above and below each wafer supported in the wafer slots 26 of the container 10. As depicted, the exhale openings 102A are substantially aligned with the inhale openings 104A, and one of the exhale openings 102A and its corresponding inhale opening 104A may collectively be referred to as an opening pair 102A/104A. Each opening pair 102A/104A is aligned with a space 28 between two immediately adjacent wafers 24. State differently, each of the openings 102A of the inlet pipe 102 has a corresponding opening 104A of the outlet pipe 104 between two immediately adjacent wafers 24. In some embodiments, each of the openings 102A of the inlet pipe 102 and its corresponding opening 104A of the outlet pipe 104 have substantially the same height.

In various embodiments, the openings 102A and 104A can be spaced to span one or more wafer positions, thereby requiring fewer openings 102A/104A for a given pipe. In general, the inhale openings 104A are provided in appropriate number and position such that a purge gas will be distributed across the height of the FOUP, and the purge gas will be uniformly directed between each pair of wafers as well as above the top wafer and below the bottom wafer in a FOUP.

As such, with this configuration, the gas flow along a surface of a give wafer may be stable and approaches to a laminar flow instead of a turbulent flow. Accordingly, particles dropping on the wafer surface may be reduced, thereby improving the purging quality of the FOUP.

Figure 2A:
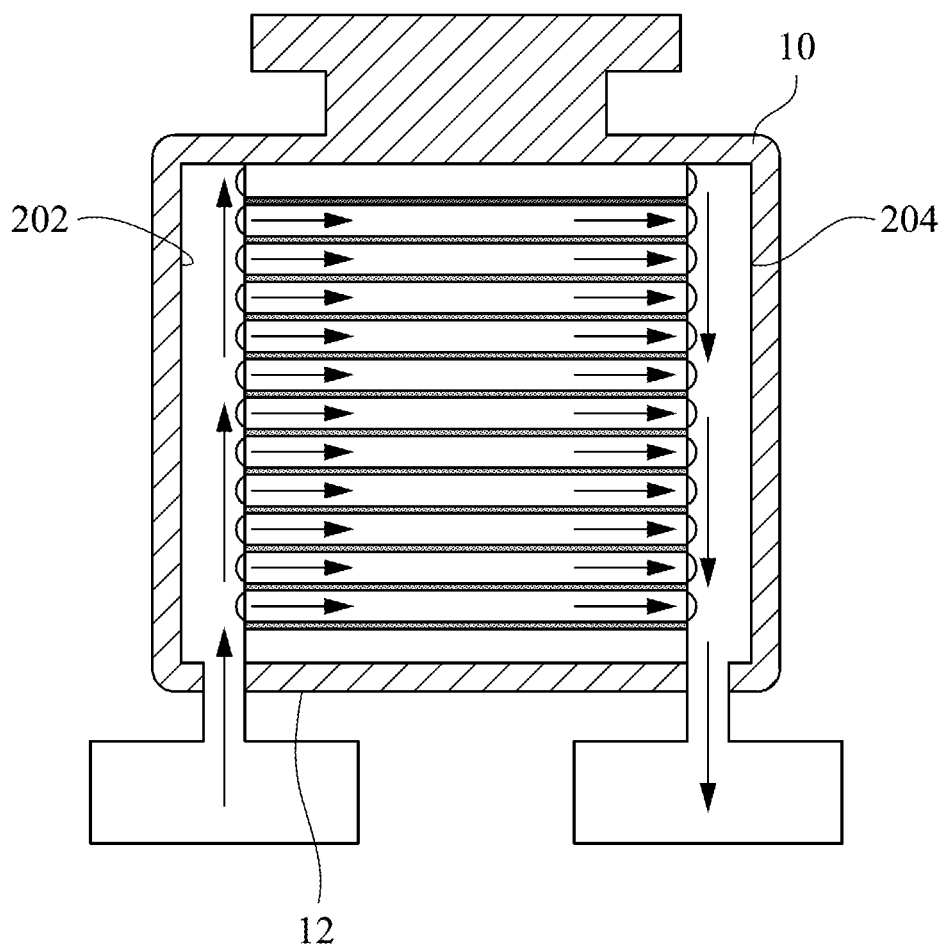
FIG. 2A is a cross-sectional view of a FOUP in accordance with some embodiments of the present disclosure.

FIG. 2A is a cross-sectional view of a FOUP 2 in accordance with some embodiments of the present disclosure. Shown therein is a cross-sectional view of a FOUP 2, in which the cross-section of FIG. 2A is the same as that of FIG. 1B.

Many aspects of the FOUP 2 are the same as or similar to those of the FOUP 1 of FIGS. 1A and 1B, and details in these aspects are not repeated hereinafter. Different from the FOUP 1 of FIGS. 1A and 1B, the FOUP 2 includes an inlet pipe 202 and an outlet pipe 204 attaching inner sidewalls of a container 10 of the FOUP 2. In other words, the inlet pipe 202 and the outlet pipe 204 are in contact with the inner sidewalls of the container 10 of the FOUP 2. In some embodiments, the inlet pipe 202 and the outlet pipe 204 are removable. In some other embodiments, the inlet pipe 202 and the outlet pipe 204 are integrally formed in the container 10 of FOUP 2. That is, container 10 of the FOUP 2, the inlet pipe 202, and the outlet pipe 204 are monolithically formed. Such configuration may save space in the FOUP 2 and further reduce the size of the FOUP 2.

Figure 2B:
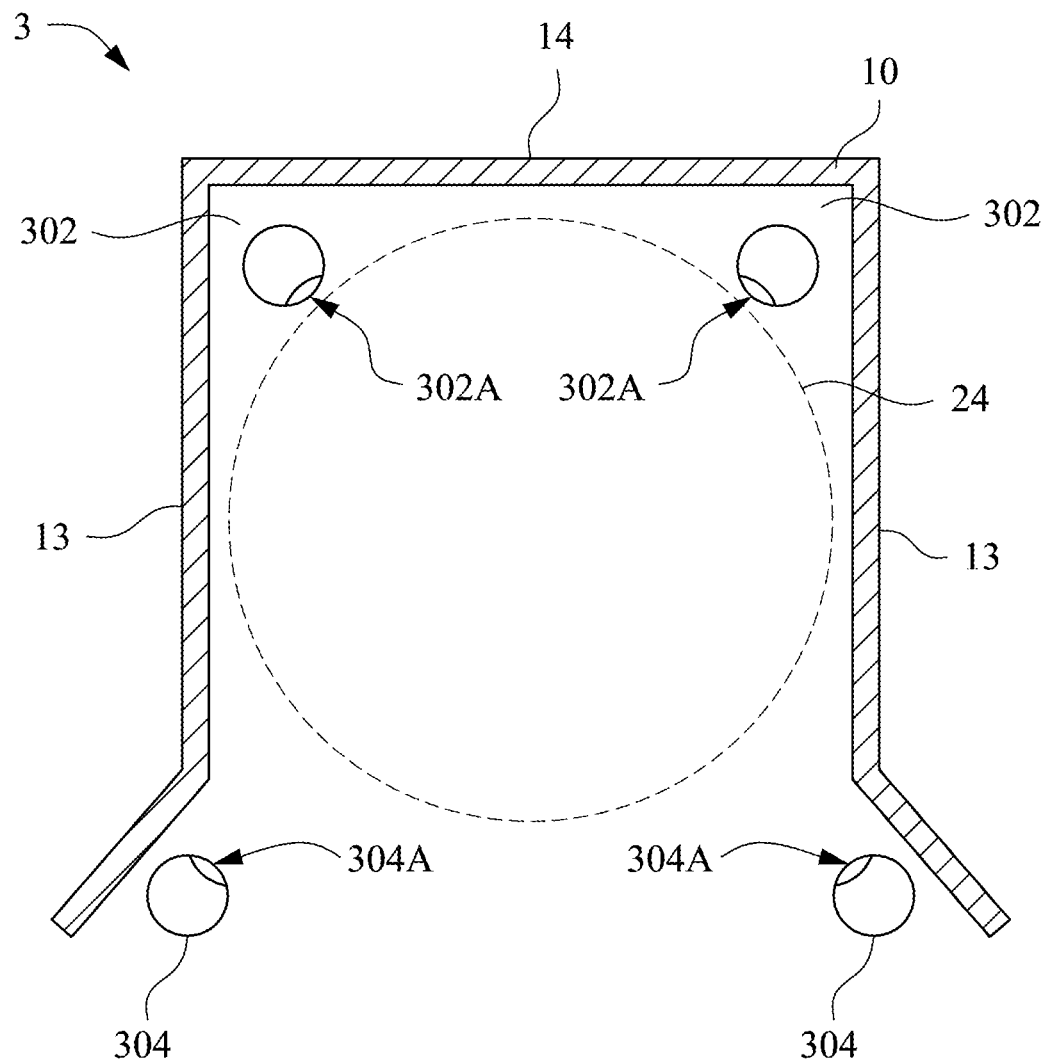
FIG. 2B is a top view of a FOUP in accordance with some embodiments of the present disclosure.

FIG. 2B is a top view of a FOUP 3 in accordance with some embodiments of the present disclosure.

Many aspects of the FOUP 3 are the same as or similar to those of the FOUP 1 of FIGS. 1A and 1B, and details in these aspects are not repeated hereinafter. Different from the FOUP 1 of FIGS. 1A and 1B, the FOUP 3 includes a plurality of inlet pipes 302 and outlet pipes 304. In the present embodiments, the number of the inlet pipes 302 and the number of the outlet pipes 304 are two, respectively. However, the present disclosure is not limited thereto.

The inlet pipes 302 are disposed close to the rear wall 14 of the container 10 of FOUP 3, and the outlet pipes 304 are disposed close to the opening of the container 10 of the FOUP 3, respectively. In greater detail, the inlet pipes 302 are disposed respectively at the corners close to the back side of the accommodation space S of the container 10, and the outlet pipes 304 are disposed respectively at the corners close to the front side the accommodation space S of the container 10. Further, the inlet pipes 302 have openings 302A substantially facing the front side of the FOUP 3, and the outlet pipes 304 have openings 304A substantially facing the back side of the FOUP 3, so as to direct the purge gas substantially flows from the back side toward the front side of the FOUP 3. With this configuration, the purge gas may uniformly flow through the wafer, thereby improving the purging quality of the FOUP 3.

Figure 3A:
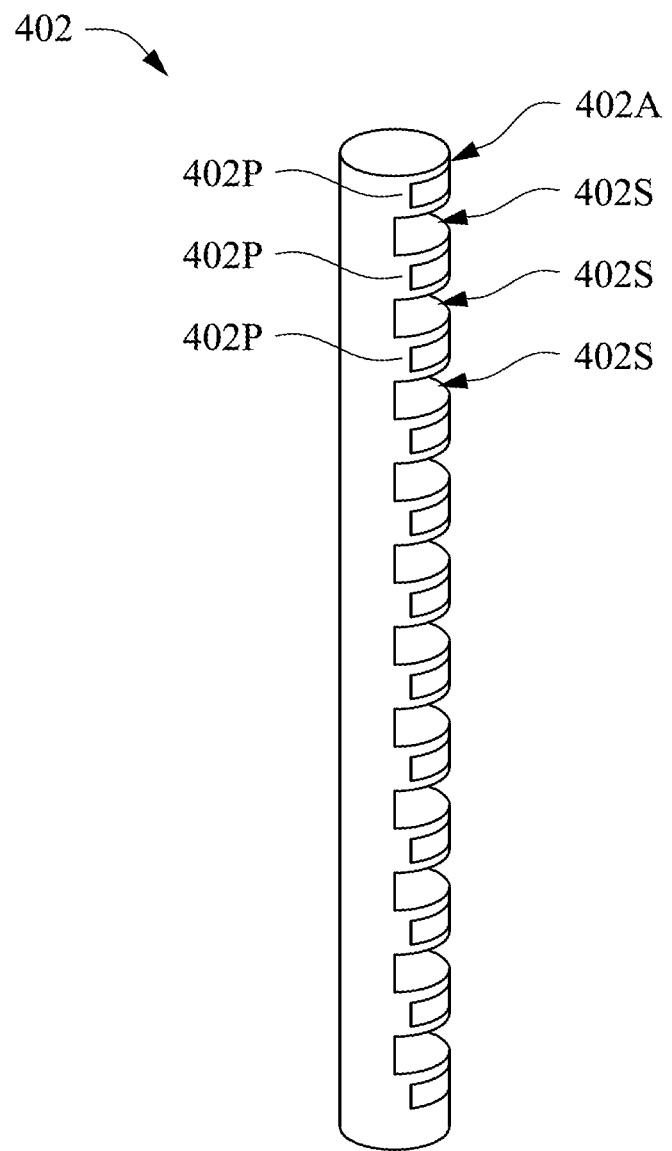
FIG. 3A is a perspective view of a gas pipe in accordance with some embodiments of the present disclosure.
Figure 3B:
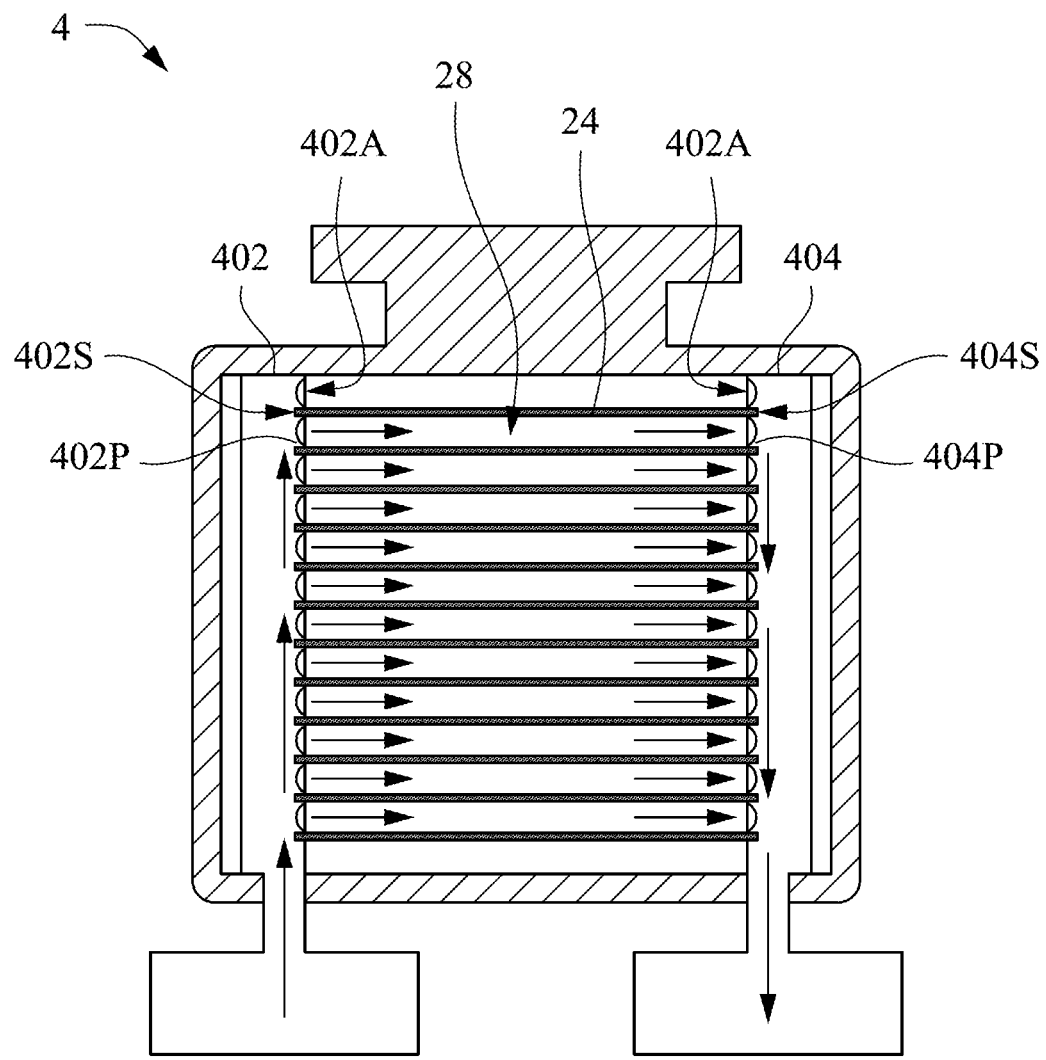
FIG. 3B is a cross-sectional view of a FOUP in accordance with some embodiments of the present disclosure.

FIG. 3A is a perspective view of a gas pipe in accordance with some embodiments of the present disclosure. FIG. 3B is a cross-sectional view of a FOUP in accordance with some embodiments of the present disclosure.

Reference is made to FIG. 3A. Shown there is an inlet pipe 402 substantially in a tubular shape and having a plurality of openings 402A disposed thereon. Different from the inlet pipe 102 shown in FIG. 1C, the inlet pipe 402 has a plurality of protrusion portions 402P vertically arranged along the inlet pipe 402, in which the openings 402A are disposed respectively at the protrusion portions 402P. Accordingly, at least an accommodation slot 402S are formed between two immediately adjacent protrusion portions 402P. The accommodation slots 402S of the inlet pipe 402 provide spaces to receive wafers, and will be discussed in conjunction with FIG. 3B.

Referring to FIG. 3B, shown there is a FOUP 4. Many aspects of the FOUP 4 are the same as or similar to those of the FOUP 1 of FIGS. 1A and 1B, and details in these aspects are not repeated hereinafter. Different from the FOUP 1 of FIGS. 1A and 1B, the FOUP 4 has an inlet pipe 402 and an outlet pipe 404. The structure of the inlet pipe 402 is discussed in FIG. 3A, and the structure of the outlet pipe 404 is the same as or similar to the inlet pipe 402. In the present embodiment, the wafers 24 engage the accommodation slot 402S and 404S of the inlet pipe 402 and the outlet pipe 404, respectively. From other perspectives, the protrusion portions 402P and 404P of the inlet pipe 402 and the outlet pipe 404 extend to the spaces 28 in between two immediately adjacent wafers 24. With this configuration, a purge gas may be directed from one inlet pipe 402 to the corresponding wafers 24, and may be removed uniformly through the corresponding outlet pipe 404. As such, the purging quality of the FOUP may be improved.

Figure 4A:
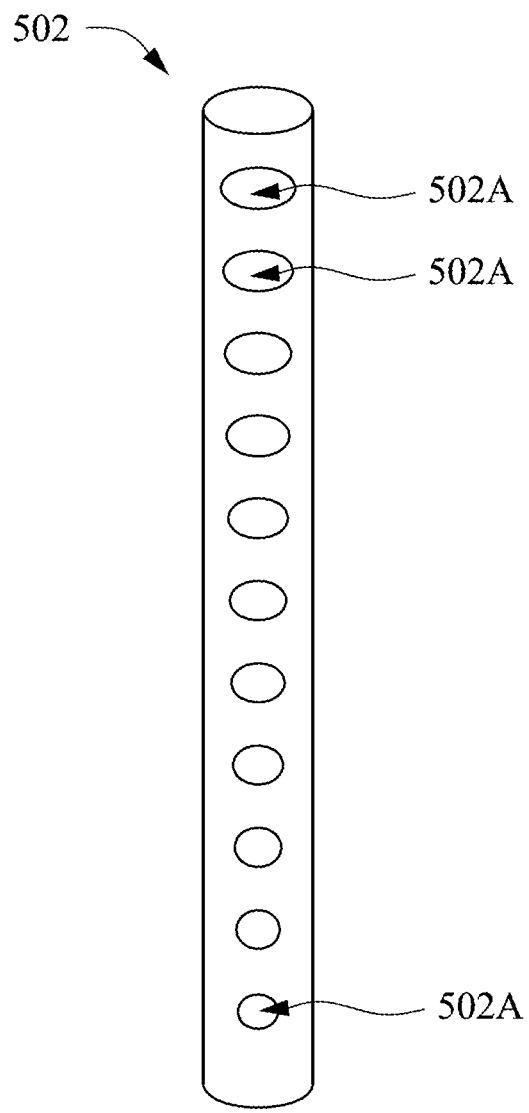
FIG. 4A is a perspective view of gas pipe in accordance with some embodiments of the present disclosure.
Figure 4B:
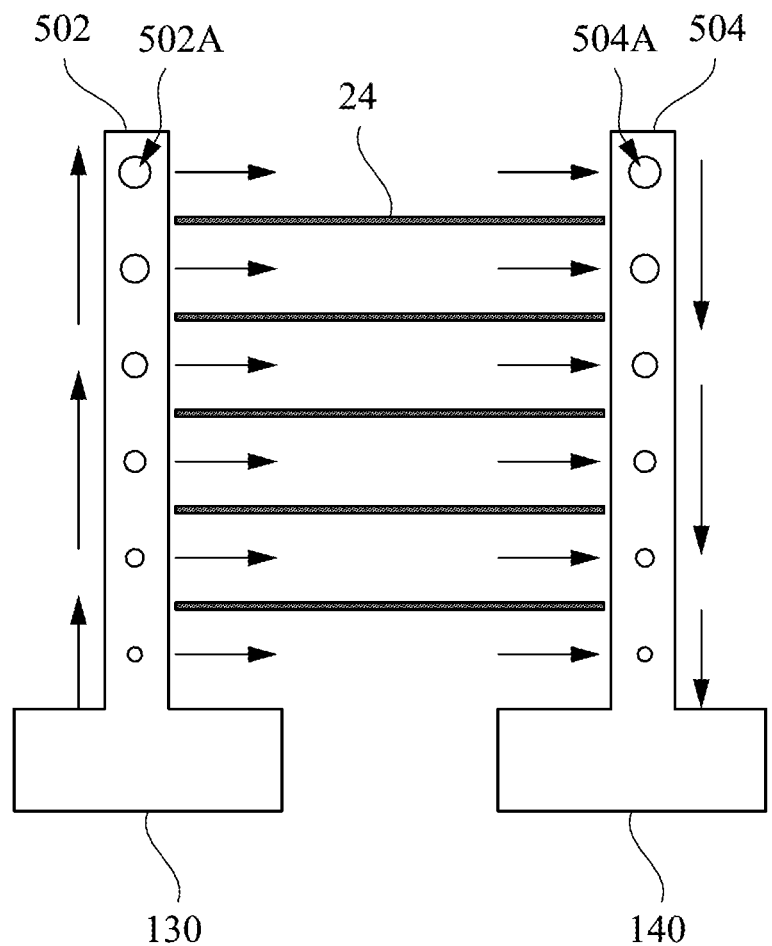
FIG. 4B is a schematic view of a FOUP in accordance with some embodiments of the present disclosure.

FIG. 4A is a perspective view of gas pipe in accordance with some embodiments of the present disclosure. FIG. 4B is a schematic view of a FOUP in accordance with some embodiments of the present disclosure.

Reference is made to FIG. 4A. Shown there is an inlet pipe 502 substantially in a tubular shape and having a plurality of openings 502A disposed thereon. Different from the inlet pipe 102 shown in FIG. 1C, the size of the openings 502A of the inlet pipe 502 gradually increase from the bottom to the top of the inlet pipe 502. In greater detail, the cross-sectional areas of the openings 502A gradually increase along the inlet pipe 502.

Reference is made to FIG. 4B. Shown there are the inlet pipe 502, an outlet pipe 504, and a plurality of wafers 24 therebetween, in which the structure of the outlet pipe 504 is the same as or similar to that of the inlet pipe 502. Similar to that discussed above, the inlet pipe 502 and the outlet pipe 504 have openings 502A and 504A gradually increase from a bottom to a top of the container of a FOUP. Further, in some embodiments, the inlet pipe 502 and the outlet pipe 504 may be connected respectively to a gas source 130 and a vacuum pump 140, in which the gas source 130 is configured to import a purge gas into the inlet pipe 502, and the vacuum pump 140 is configured to remove the purge gas from the outlet pipe 504. In some embodiments, the smallest opening 502A of the inlet pipe 502 is close to the gas source 130, and the smallest opening 504A of the outlet pipe 504 is close to the vacuum pump 140. Alternatively, the smallest opening 502A of the inlet pipe 502 and the smallest opening 504A of the outlet pipe 504 are close to the bottom of a FOUP. Such configuration may balance the flow rates of the purge gas flowed through different wafers at different height, so as to improve the uniformity of purging.

According to the aforementioned embodiments, at least one inlet pipe and at least one outlet pipe are disposed in a container of a FOUP. The inlet pipe has a plurality of exhale opening arranged along the inlet pipe, and outlet pipe has a plurality of inhale opening arranged along the outlet pipe, respectively. The exhale openings of the inlet pipe correspond respectively to the inhale openings of the outlet pipe so as to direct a gas flow from the exhale openings into spaces between two adjacent wafers and remove the gas flow through the corresponding inhale openings of the outlet pipe. With this configuration, the gas flow along surfaces of the wafers may be stable and approaches to a laminar flow instead of a turbulent flow. Accordingly, particles dropping on the wafer surface may be reduced, thereby improving the purging quality of the FOUP.

Although the present invention has been described in considerable detail with reference to certain embodiments thereof, other embodiments are possible. Therefore, the spirit and scope of the appended claims should not be limited to the description of the embodiments contained herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A front opening unified pod (FOUP), comprising:
   a container;

at least one inlet pipe having a tubular shape disposed in the container, wherein the inlet pipe comprises a plurality of recesses disposed inwardly from a curved surface of the inlet pipe for holding wafers, and a plurality of exhale openings disposed on the curved surface of the inlet pipe for supplying purge gas, and wherein the recesses and the exhale openings are alternately arranged along a lengthwise direction of the inlet pipe, and the recesses are vertically aligned with the exhale openings; and at least one outlet pipe disposed in the container, wherein the outlet pipe has a plurality of inhale openings arranged along the outlet pipe.

2. The FOUP of claim 1, wherein a number of the exhale openings is the same as a number of the inhale openings.

3. The FOUP of claim 1, wherein the exhale openings of the inlet pipe are substantially aligned with the inhale openings of the outlet pipe.

4. The FOUP of claim 3, wherein the exhale openings and their corresponding inhale openings have substantially the same heights.

5. The FOUP of claim 1, wherein the inlet pipe is disposed at a back side of the container and the outlet pipe is disposed at a front side of the container.

6. The FOUP of claim 1, wherein the inlet pipe and the outlet pipe are disposed respectively at corners along a diagonal of the container.

7. The FOUP of claim 1, wherein the inlet pipe and the outlet pipe are in contact with inner sidewalls of the container.

8. The FOUP of claim 7, wherein the inlet pipe, the outlet pipe, and the container are monolithically formed.

9. The FOUP of claim 1, wherein the inlet pipe and the outlet pipe are plural.

10. The FOUP of claim 9, wherein the inlet pipes are disposed respectively at corners close to a back side of the container and the outlet pipes are disposed respectively at corners close to a front side of the container.

11. The FOUP of claim 1, wherein the outlet pipe has a plurality of protrusion portions arranged along the outlet pipe, and the openings of the outlet pipe are disposed respectively at the protrusion portions of the outlet pipe.

12. The FOUP of claim 11, wherein:
the outlet pipe has a plurality of wafer accommodation slots between the protrusion portions of the outlet pipe for holding wafers.

13. The FOUP of claim 1, wherein:
the sizes of the exhale openings of the inlet pipe gradually increase along the inlet pipe; and
the sizes of the inhale openings of the outlet pipe gradually increase along the outlet pipe.

14. The FOUP of claim 13, wherein the smallest exhale opening and the smallest inhale opening are close to a bottom of the container.

15. The FOUP of claim 13, wherein the inlet pipe and the outlet pipe are configured to be connected respectively with a gas source and a vacuum pump, and the smallest exhale opening and the smallest inhale opening are close respectively to the gas source and the vacuum pump.

16. The FOUP of claim 1, wherein the inlet pipe and the outlet pipe extend substantially a full height of the container.

17. The FOUP of claim 11, wherein each of the protrusion portions of the inlet pipe has a flat top surface and a flat bottom surface.

18. The FOUP of claim 1, wherein the recesses are wider than the exhale openings.

19. The FOUP of claim 1, wherein the curved surface of the inlet pipe is a convex surface.

* * * * *